US011355917B2

(12) United States Patent
Huang

(10) Patent No.: US 11,355,917 B2
(45) Date of Patent: Jun. 7, 2022

(54) PROTECTIVE CIRCUIT AND DISPLAY DRIVE DEVICE

(71) Applicant: HKC Corporation Limited, Shenzhen (CN)

(72) Inventor: Xiaoyu Huang, Shenzhen (CN)

(73) Assignee: HKC Corporation Limited, Shenzhen (CN)

(*) Notice: Subject to any disclaimer, the term of this patent is extended or adjusted under 35 U.S.C. 154(b) by 0 days.

(21) Appl. No.: 17/043,872

(22) PCT Filed: Nov. 28, 2018

(86) PCT No.: PCT/CN2018/118011
§ 371 (c)(1),
(2) Date: Sep. 30, 2020

(87) PCT Pub. No.: WO2020/093482
PCT Pub. Date: May 14, 2020

(65) Prior Publication Data
US 2021/0028618 A1 Jan. 28, 2021

(30) Foreign Application Priority Data
Nov. 7, 2018 (CN) .......................... 201811319149.0

(51) Int. Cl.
*H02H 3/20* (2006.01)
*G09G 3/36* (2006.01)
(Continued)

(52) U.S. Cl.
CPC ............ *H02H 3/20* (2013.01); *G09G 3/3696* (2013.01); *H02H 9/025* (2013.01); *H01L 27/02* (2013.01)

(58) Field of Classification Search
CPC . H01L 27/02; H01L 27/0266; H01L 27/0274; H01L 27/0262; H02H 3/20;
(Continued)

(56) References Cited

U.S. PATENT DOCUMENTS 3,931,546 A   1/1976   Jakobs et al.
7,800,878 B2* 9/2010   Komatsu ............. H02H 11/003
                                              361/93.1
(Continued)

FOREIGN PATENT DOCUMENTS

CN    104218529 A    12/2014
CN    107705742 A     2/2018
(Continued)

OTHER PUBLICATIONS

International Search Report dated Aug. 13, 2019, issued in corresponding International Application No. PCT/CN2018/118011, filed Nov. 28, 2018, 2 pages.
(Continued)

*Primary Examiner* — Danny Nguyen
(74) *Attorney, Agent, or Firm* — Rosenberg, Klein & Lee

(57) ABSTRACT

A protective circuit (301) and a display drive device. The protective circuit (301) comprises: when an electrical overstress problem occurs in a logic signal, the voltage of an output end of a controlled switch circuit (100) is greater than a first preset voltage, so that a voltage threshold circuit (101) is turned on, and the controlled switch circuit (100) turns off an input end and the output end thereof, thereby preventing electrical overstress from affecting a driver chip (300) and causing damage to the driver chip (300). Moreover, the voltage potential of a controlled end of the controlled switch circuit (100) is clamped by means of a voltage clamp circuit (102) to stabilize the operating characteristics of the controlled switch circuit (100).

17 Claims, 3 Drawing Sheets

(51) Int. Cl.
*H02H 9/02* (2006.01)
*H01L 27/02* (2006.01)

(58) Field of Classification Search
CPC .......... H02H 9/025; H02H 9/043; H02H 9/04; H02H 3/08; H02H 9/041; H02H 9/046; G02F 1/136204
USPC .......................................... 361/56, 91.1, 111
See application file for complete search history.

(56) References Cited

U.S. PATENT DOCUMENTS

| | | | |
|---|---|---|---|
| 8,861,164 B2* | 10/2014 | Mikolajczak | H02H 3/20 |
| | | | 361/93.8 |
| 2014/0146426 A1* | 5/2014 | Murakami | G02F 1/136204 |
| | | | 361/56 |
| 2016/0141867 A1* | 5/2016 | Boecker | H02H 9/041 |
| | | | 361/56 |
| 2017/0013694 A1* | 1/2017 | Nakamura | H05B 45/50 |
| 2020/0014294 A1* | 1/2020 | Song | H02J 7/00 |

FOREIGN PATENT DOCUMENTS

| | | |
|---|---|---|
| CN | 207664618 U | 7/2018 |
| CN | 109166557 A | 1/2019 |
| JP | 2006067187 A | 3/2006 |

OTHER PUBLICATIONS

Notice of Reason for Rejection dated Oct. 9, 2019, issued in Chinese Application No. 201811319149 0, filed Nov. 7, 2018, 7 pages.

* cited by examiner

PROTECTIVE CIRCUIT AND DISPLAY DRIVE DEVICE

CROSS REFERENCE TO RELATED APPLICATIONS

This application claims priority to Chinese Patent Application No. 2018113191490, entitled "PROTECTIVE CIRCUIT AND DISPLAY DRIVE DEVICE", and filed with the Patent Office of China on Nov. 7, 2018, which is incorporated by reference in its entirety.

TECHNICAL FIELD

This application relates to the field of crystal liquid display device technologies, and in particular, to a protection circuit and a display drive device.

BACKGROUND

The description herein only provides background information related to this application, but does not necessarily constitute the prior art. A crystal liquid display panel is a display device formed by a certain quantity of color or black and white pixels and placed in front of a light source or a reflective surface. A thin film transistor liquid crystal display (TFT-LCD) is one of the main types of current crystal liquid display panels, and has become an important display platform in modern IT and video products. Using a display drive of the TFT-LCD as an example, a system motherboard connects an R/G/B compression signal, a control signal, and a power supply to a connector on a PCB board through a wire rod. After data is processed by an IC of a timing controller (TCON) on the PCB board, the data is connected to a display area via the PCB board through a source-chip on film (S-COF) and a gate-chip on film (G-COF), and a voltage is transmitted through a data line and a scan line on a display array, so that the TFT-LCD implements a display function. That is, in the crystal liquid display panel, a logic signal input from a front end needs to be converted into a drive signal by a corresponding drive chip.

However, the inventor realizes that a misoperation of an operator or a contact of a related component by mistake easily causes an electrical over stress (EOS) problem. That is, an input voltage corresponding to a logic signal exceeds a voltage withstanding value of the drive chip, causing damage to the drive chip.

SUMMARY

According to various embodiments disclosed in this application, a protection circuit and a display drive device are provided.

The protection circuit includes a controlled switch circuit, a voltage threshold circuit, and a voltage clamp circuit, wherein:

an input end of the controlled switch circuit is configured to receive a logic signal, an output end of the controlled switch circuit is configured to be connected to an input end of a drive chip, and a controlled end of the controlled switch circuit is connected to the output end of the controlled switch circuit through the voltage threshold circuit;

the controlled end of the controlled switch circuit is further configured to be grounded through the voltage clamp circuit;

the voltage threshold circuit is configured to be turned on when a voltage at the output end of the controlled switch circuit is greater than a first preset voltage; and the controlled switch circuit is configured to be turned off with no conduction between the input end and the output end of the controlled switch circuit when the voltage threshold circuit is turned on.

In the foregoing protection circuit, when a problem of an electrical over stress occurs in a logic signal, the voltage at the output end of the controlled switch circuit is greater than the first preset voltage, so that the voltage threshold circuit is turned on, and the controlled switch circuit is turned off with no conduction between the input end and the output end of the controlled switch circuit, to prevent the electrical over stress from affecting the drive chip and causing damage to the drive chip. Meanwhile, a voltage potential of the controlled end of the controlled switch circuit is clamped through the voltage clamp circuit, to stabilize operating features of the controlled switch circuit.

In an embodiment, a front-end threshold circuit is further included;

the output end of the controlled switch circuit is configured to be grounded through the front-end threshold circuit; and the front-end threshold circuit is configured to be turned on when the voltage at the output end of the controlled switch circuit is greater than a second preset voltage, where the first preset voltage is greater than the second preset voltage.

In an embodiment, the controlled switch circuit includes an electronic switch or a field effect transistor.

In an embodiment, the field effect transistor includes a P-channel field effect transistor.

In an embodiment, the voltage threshold circuit includes a first voltage regulator diode; and a positive electrode of the first voltage regulator diode is connected to the controlled end of the controlled switch circuit, and a negative electrode of the first voltage regulator diode is connected to the output end of the controlled switch circuit.

In an embodiment, the front-end threshold circuit includes a second voltage regulator diode; and a positive electrode of the second voltage regulator diode is configured to be grounded, and a negative electrode of the second voltage regulator diode is connected to the output end of the controlled switch circuit.

In an embodiment, the voltage clamp circuit includes a clamp resistor.

In an embodiment, a protective resistor is further included; and a positive electrode of the second voltage regulator diode is grounded through the protective resistor.

In an embodiment, a bias resistor is further included; and a gate of the P-channel field effect transistor is connected to a source of the P-channel field effect transistor through the bias resistor.

The drive device includes a drive chip and a protection circuit, wherein:

the protection circuit includes a controlled switch circuit, a voltage threshold circuit, and a voltage clamp circuit;

an input end of the controlled switch circuit is configured to receive a logic signal, an output end of the controlled switch circuit is configured to be connected to an input end of the drive chip, and a controlled end of the controlled switch circuit is connected to the output end of the controlled switch circuit through the voltage threshold circuit;

the controlled end of the controlled switch circuit is further configured to be grounded through the voltage clamp circuit;

the voltage threshold circuit is configured to be turned on when a voltage at the output end of the controlled switch circuit is greater than a first preset voltage; and the controlled switch circuit is configured to be turned off with no conduction between the input end and the output end of the controlled switch circuit when the voltage threshold circuit is turned on; and an output end of the drive chip is configured to output a drive signal to a display array of a crystal liquid display panel.

In the foregoing display drive device, when a problem of an electrical over stress occurs in a logic signal the voltage at the output end of the controlled switch circuit is greater than a first preset voltage, so that the voltage threshold circuit is turned on, and the controlled switch circuit is turned off with no conduction between the input end and the output end of the controlled switch circuit, to prevent the electrical over stress from affecting the drive chip and causing damage to the drive chip. Meanwhile, a voltage potential of the controlled end of the controlled switch circuit is clamped by using the voltage clamp circuit, to stabilize operating features of the controlled switch circuit.

In an embodiment, the protection circuit further includes a front-end threshold circuit;

the output end of the controlled switch circuit is configured to be grounded through the front-end threshold circuit; and the front-end threshold circuit is configured to be turned on when the voltage at the output end of the controlled switch circuit is greater than a second preset voltage, where the first preset voltage is greater than the second preset voltage.

In an embodiment, the controlled switch circuit includes an electronic switch or a field effect transistor.

In an embodiment, the field effect transistor includes a P-channel field effect transistor.

In an embodiment, the voltage threshold circuit includes a first voltage regulator diode; and a positive electrode of the first voltage regulator diode is connected to the controlled end of the controlled switch circuit, and a negative electrode of the first voltage regulator diode is connected to the output end of the controlled switch circuit.

In an embodiment, the front-end threshold circuit includes a second voltage regulator diode; and a positive electrode of the second voltage regulator diode is configured to be grounded, and a negative electrode of the second voltage regulator diode is connected to the output end of the controlled switch circuit.

In an embodiment, the voltage clamp circuit includes a clamp resistor.

In an embodiment, a protective resistor is further included; and a positive electrode of the second voltage regulator diode is grounded through the protective resistor.

In an embodiment, a bias resistor is further included; and a gate of the P-channel field effect transistor is connected to a source of the P-channel field effect transistor through the bias resistor.

The display apparatus includes a display module and a drive device, where the drive device includes a drive chip and a protection circuit;

the protection circuit includes a controlled switch circuit, a voltage threshold circuit, and a voltage clamp circuit;

an input end of the controlled switch circuit is configured to receive a logic signal, an output end of the controlled switch circuit is configured to be connected to an input end of the drive chip, and a controlled end of the controlled switch circuit is connected to the output end of the controlled switch circuit through the voltage threshold circuit;

the controlled end of the controlled switch circuit is further configured to be grounded through the voltage clamp circuit;

the voltage threshold circuit is configured to be turned on when a voltage at the output end of the controlled switch circuit is greater than a first preset voltage; and the controlled switch circuit is configured to be turned off with no conduction between the input end and the output end of the controlled switch circuit when the voltage threshold circuit is turned on; and an output end of the drive chip is configured to output a drive signal to a display array of a crystal liquid display panel; and the drive chip is configured to drive a display array in the display module.

In the foregoing display apparatus, when a problem of an electrical over stress occurs in a logic signal, the voltage at the output end of the controlled switch circuit is greater than the first preset voltage, so that the voltage threshold circuit is turned on, and the controlled switch circuit is turned off with no conduction between the input end and the output end of the controlled switch circuit, to prevent the electrical over stress from affecting the drive chip and causing damage to the drive chip. Meanwhile, a voltage potential of the controlled end of the controlled switch circuit is clamped by using the voltage clamp circuit, to stabilize operating features of the controlled switch circuit.

In an embodiment, the protection circuit further includes a front-end threshold circuit;

the output end of the controlled switch circuit is configured to be grounded through the front-end threshold circuit; and the front-end threshold circuit is configured to be turned on when the voltage at the output end of the controlled switch circuit is greater than a second preset voltage, where the first preset voltage is greater than the second preset voltage.

Details of one or more embodiments of this application are provided in the following accompanying drawings and descriptions. Other features and advantages of this application become more obvious with reference to the specification, the accompanying drawings, and the claims.

BRIEF DESCRIPTION OF THE DRAWINGS

To describe the technical solutions of the embodiments of this application more clearly, the following briefly introduces the accompanying drawings required for the embodiments. Apparently, the accompanying drawings in the following description show merely some embodiments of this application, and a person of ordinary skill in the prior art may still derive other drawings from these accompanying drawings without creative efforts.

DETAILED DESCRIPTION OF THE EMBODIMENTS

To make the technical solutions and advantages of this application clearer and more comprehensible, the following further describes this application in detail with reference to the accompanying drawings and embodiments. It should be understood that the specific embodiments described herein are merely used to explain this application but are not configured to limit this application.

An embodiment of the present disclosure provides a protection circuit.

Figure 1:
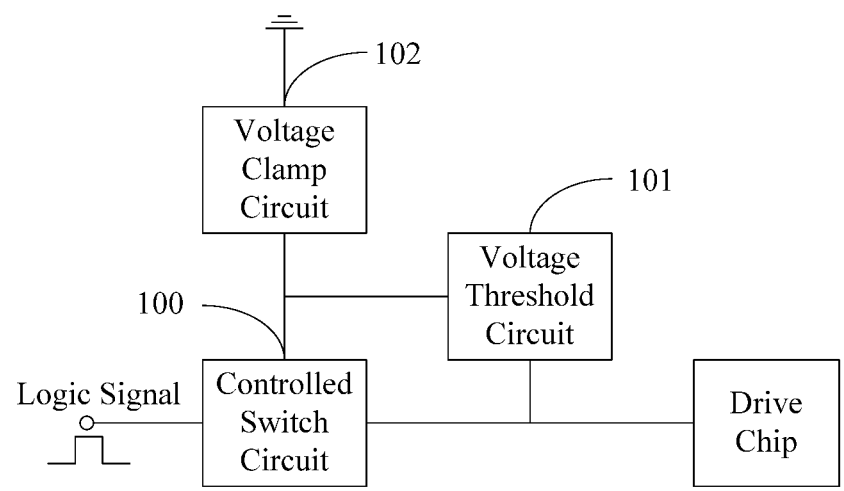
FIG. 1 is a circuit structure diagram of a protection circuit according to one or more embodiments.

FIG. 1 is a circuit structure diagram of a protection circuit according to one or more embodiments. As shown in FIG. 1, the protection circuit of an implementation includes a controlled switch circuit 100, a voltage threshold circuit 101, and a voltage clamp circuit 102.

An input end of the controlled switch circuit 100 is configured to receive a logic signal, an output end of the controlled switch circuit 100 is configured to be connected to an input end of a drive chip, and a controlled end of the controlled switch circuit 100 is connected to the output end of the controlled switch circuit 100 through the voltage threshold circuit 101.

The controlled end of the controlled switch circuit 100 is further configured to be grounded through the voltage clamp circuit 102.

The voltage threshold circuit 101 is configured to be turned on when a voltage at the output end of the controlled switch circuit 100 is greater than a first preset voltage.

The controlled switch circuit 100 is configured to be turned off with no conduction between the input end and the output end of the controlled switch circuit when the voltage threshold circuit 101 is turned on.

In an embodiment, after the voltage threshold circuit 101 is turned on, the voltage at the output end of the controlled switch circuit 100 is transmitted to the controlled end. Generally, the controlled switch circuit 100 is in an ON state with conduction between the input end and the output end of the controlled switch circuit 100, and the voltage at the output end of the controlled switch circuit 100 is the same as the voltage at the received logic signal. When an electrical over stress occurs in the received logic signal, the voltage threshold circuit 101 is turned on, so that a voltage at the controlled end of the controlled switch circuit 100 is at a high potential, and therefore, the input end and the output end are turned off. In an embodiment, the first preset voltage is determined according to an electrical over stress tolerance of the drive chip. Generally, the first preset voltage is greater than 18 V and less than 22 V. In a preferred implementation, the first preset voltage is 20 V.

In an embodiment, the controlled switch circuit 100 includes an electronic switch or a field effect transistor.

In an embodiment, when an electrical overstress occurs and the voltage threshold circuit 101 is turned on, a voltage at the controlled end of the controlled switch circuit 100 is greater than the first preset voltage. Correspondingly, a condition under which the electronic switch or the field effect transistor is on is that the voltage at the controlled end is greater than the first preset voltage.

Through the electronic switch or the field effect transistor, an implementation condition of the controlled switch circuit 100 is met, and the controlled switch circuit 100 turned on according to a threshold adjustment is provided.

In an embodiment, the voltage clamp circuit 102 is configured to clamp a voltage at the controlled end of the controlled switch circuit 100 when the voltage threshold circuit 101 is turned on, to stabilize the voltage at the controlled end.

Figure 2:
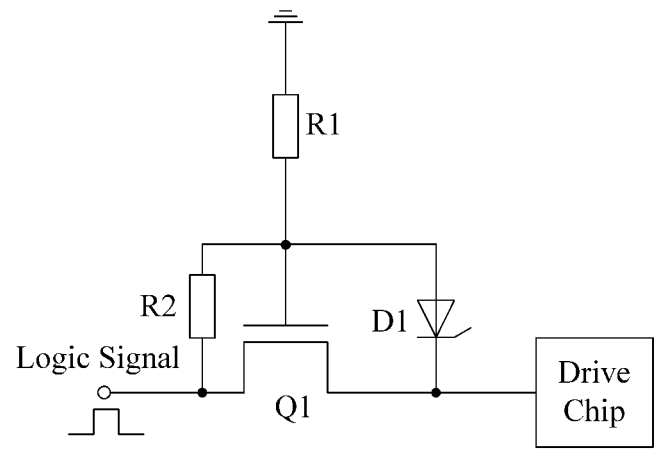
FIG. 2 is a schematic diagram illustrating a protection circuit according to one or more embodiments.

In an embodiment, FIG. 2 is a schematic diagram illustrating a protection circuit according to one or more embodiments. As shown in FIG. 2, the controlled switch circuit 100 includes a P-channel field effect transistor Q1.

In an embodiment, the controlled end of the controlled switch circuit 100 is a gate of a P-channel field effect transistor Q1, the input end of the controlled switch circuit 100 is a source of the P-channel field effect transistor Q1, and the output end of the controlled switch circuit 100 is a drain of the P-channel field effect transistor Q1. In an embodiment, when the voltage threshold circuit 101 is turned on, the gate of the P-channel field effect transistor Q1 is at a high potential, and the P-channel field effect transistor Q1 is turned off. When the voltage threshold circuit 101 is turned off, the gate of the P-channel field effect transistor Q1 is at a low potential, and the P-channel field effect transistor Q1 is turned on.

In an embodiment, as shown in FIG. 2, the voltage threshold circuit 101 includes a first voltage regulator diode D1.

A positive electrode of the first voltage regulator diode D1 is connected to the controlled end of the controlled switch circuit 100, and a negative electrode of the first voltage regulator diode D1 is connected to the output end of the controlled switch circuit 100.

In an embodiment, when an electrical over stress occurs, a voltage difference between the negative electrode and the positive electrode of the first voltage regulator diode D1 reaches a breakdown voltage at the first voltage regulator diode D1, so that the first voltage regulator diode D1 is reversely broken down, and therefore, the controlled end of the controlled switch circuit 100, that is, the gate of the P-channel field effect transistor Q1 is at a high potential. In an embodiment, the first voltage regulator diode D1 may use a voltage regulator diode with a breakdown voltage greater than 18 V and less than 22 V. In a preferred implementation, the first voltage regulator diode D1 uses a voltage regulator diode with a breakdown voltage at 20 V.

In an embodiment, as shown in FIG. 2, the voltage clamp circuit 102 includes a clamp resistor R1.

In an embodiment, when the voltage threshold circuit 101, that is, the first voltage regulator diode D1 is turned on, the voltage at the output end of the controlled switch circuit 100 and a voltage at a grounded end form a potential difference, a current flows to the grounded end through the first voltage regulator diode D1 and the clamp resistor R1 sequentially, and through the clamp resistor R1, a stable voltage difference is formed between the controlled end of the controlled switch circuit 100 and the grounded end, to maintain the high potential of the controlled end of the controlled switch circuit 100.

In an embodiment, as shown in FIG. 2, a bias resistor R2 is further included.

The gate of the P-channel field effect transistor Q1 is connected to the source of the P-channel field effect transistor Q1 through the bias resistor R2.

In an embodiment, the gate of the P-channel field effect transistor Q1 is connected to the source of the P-channel field effect transistor Q1 through the bias resistor R2. In an embodiment, the bias resistor R2 provides a bias voltage to the P-channel field effect transistor Q1, to better maintain operating features of the P-channel field effect transistor Q1.

Figure 3:
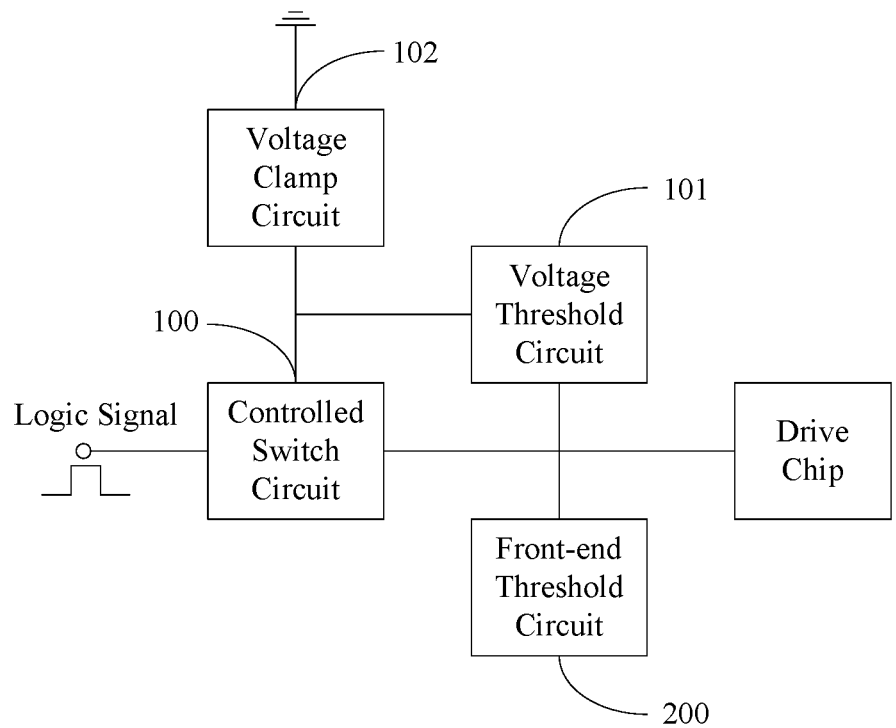
FIG. 3 is a circuit structure diagram of another protection circuit according to one or more embodiments

In an embodiment, FIG. 3 is a circuit structure diagram of another protection circuit according to one or more embodiments. As shown in FIG. 3, a front-end threshold circuit 200 is further included.

The output end of the controlled switch circuit 100 is configured to be grounded through the front-end threshold circuit 200.

The front-end threshold circuit 200 is configured to be turned on when the voltage at the output end of the controlled switch circuit 100 is greater than the second preset voltage. In an embodiment, the first preset voltage is greater than the second preset voltage.

In an embodiment, by using the front-end threshold circuit 200, when an electrical over stress occurs, and when a stress voltage corresponding to the electrical over stress is greater than the second preset voltage and less than the first preset voltage, the voltage threshold circuit 101 maintains off, and the electrical over stress may be leaked through the turned on front-end threshold circuit 200 without the need of turning off the input end and the output end of the controlled switch circuit 100. After the electrical over stress disappears, the logic signal may be output to the drive chip again, to improve operating efficiency of the protection circuit.

Figure 4:
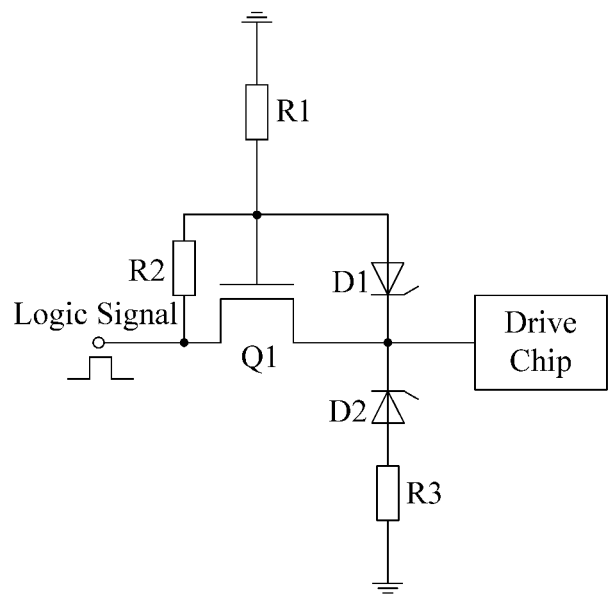
FIG. 4 is a schematic diagram illustrating another protection circuit according to one or more embodiments.

In an embodiment, FIG. 4 is a schematic diagram illustrating another protection circuit according to one or more embodiments. As shown in FIG. 4, the front-end threshold circuit 200 includes a second voltage regulator diode D2.

A positive electrode of the second voltage regulator diode D2 is configured to be grounded, and a negative electrode of the second voltage regulator diode D2 is connected to the output end of the controlled switch circuit 100.

In an embodiment, when a voltage corresponding to a logic signal is greater than the second preset voltage, the second voltage regulator diode D2 is reversely broken down, and the logic signal is transmitted to the grounded end through the second voltage regulator diode D2, to leak an electrical over stress. In an embodiment, the second preset voltage is less than the first preset voltage, that is, the second voltage regulator diode D2 may use a voltage regulator diode with a breakdown voltage less than the first preset voltage. In an embodiment, the second voltage regulator diode D2 uses a voltage regulator diode with a breakdown voltage greater than 16 V and less than or equal to 18 V. In a preferred implementation, the second voltage regulator diode D2 uses a voltage regulator diode with a breakdown voltage at 18 V.

In an embodiment, as shown in FIG. 4, the protection circuit of another implementation further includes a protective resistor R3.

The positive electrode of the second voltage regulator diode D2 is configured to be grounded through the protective resistor R3.

In an embodiment, the protective resistor R3 is used to prevent a risk caused by a short circuit in the leakage of the electrical over stress, to protect the protection circuit and related elements.

An embodiment of the present invention further provides a drive device.

Figure 5:
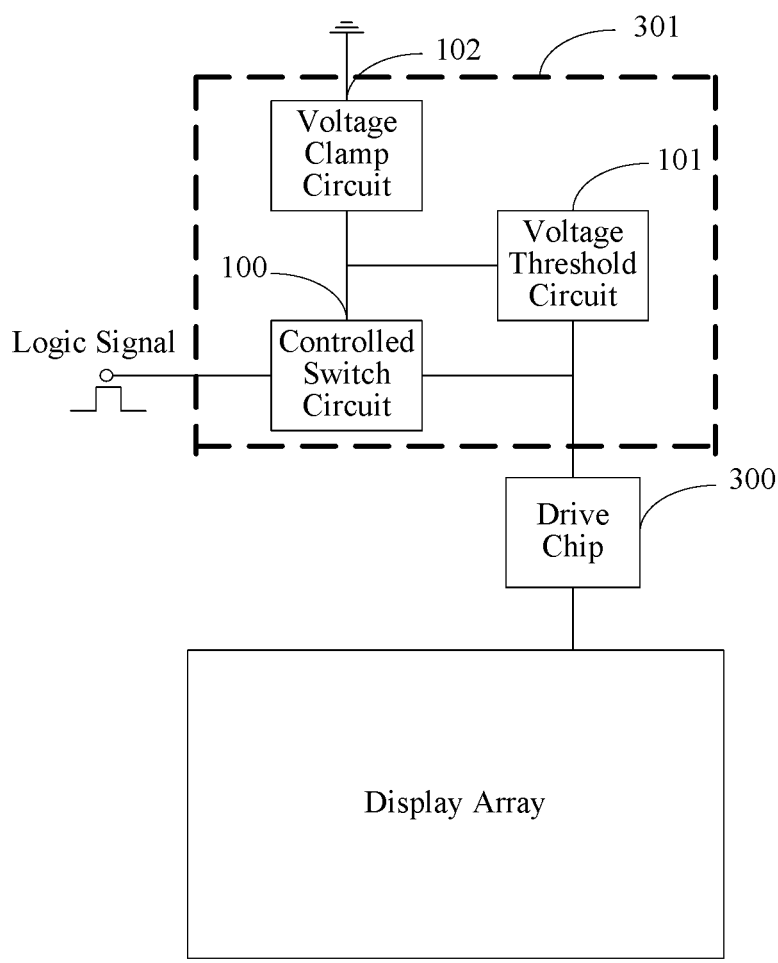
FIG. 5 is a circuit structure diagram of a display drive device according to one or more embodiments.

FIG. 5 is a circuit structure diagram of a drive device according to one or more embodiments. As shown in FIG. 5, the drive device includes a drive chip 300 and a protection circuit 301.

The protection circuit 301 includes a controlled switch circuit 100, a voltage threshold circuit 101, and a voltage clamp circuit 102.

An input end of the controlled switch circuit 100 is configured to receive a logic signal, an output end of the controlled switch circuit 100 is configured to be connected to an input end of the drive chip 300, and a controlled end of the controlled switch circuit 100 is connected to the output end of the controlled switch circuit 100 through the voltage threshold circuit 101.

The controlled end of the controlled switch circuit 100 is further configured to be grounded through the voltage clamp circuit 102.

The voltage threshold circuit 101 is configured to be turned on when a voltage at the output end of the controlled switch circuit 100 is greater than a first preset voltage.

The controlled switch circuit 100 is configured to be turned off with no conduction between the input end and the output end of the controlled switch circuit when the voltage threshold circuit 101 is turned on.

An output end of the drive chip 300 is configured to output a drive signal to a display array of a crystal liquid display panel.

An embodiment of the present invention further provides a display apparatus.

The display apparatus includes a display module and a drive device.

The drive device includes a drive chip and a protection circuit.

The protection circuit includes a controlled switch circuit, a voltage threshold circuit, and a voltage clamp circuit.

An input end of the controlled switch circuit is configured to receive a logic signal, an output end of the controlled switch circuit is configured to be connected to an input end of the drive chip, and a controlled end of the controlled switch circuit is connected to the output end of the controlled switch circuit through the voltage threshold circuit.

The controlled end of the controlled switch circuit is further configured to be grounded through the voltage clamp circuit.

The voltage threshold circuit is configured to be turned on when a voltage at the output end of the controlled switch circuit is greater than a first preset voltage.

The controlled switch circuit is configured to be turned off with no conduction between the input end and the output end of the controlled switch circuit when the voltage threshold circuit is turned on.

An output end of the drive chip is configured to output a drive signal to a display array of a crystal liquid display panel.

The drive chip is configured to drive a display array in the display module.

In the foregoing protection circuit and drive device, when a problem of an electrical over stress occurs in a logic signal, the voltage at the output end of the controlled switch circuit 100 is greater than the first preset voltage, so that the voltage threshold circuit 101 is turned on, and the controlled switch circuit 100 is turned off with no conduction between the input end and the output end of the controlled switch circuit, to prevent the electrical over stress from affecting a drive chip and causing damage to the drive chip. Meanwhile, a voltage potential of the controlled end of the controlled switch circuit 100 is clamped through the voltage clamp circuit 102, to stabilize operating features of the controlled switch circuit 100.

Various technical features in the foregoing embodiments may be combined randomly. For ease of description, possible combinations of various technical features in the foregoing embodiments are not all described. However, the combinations of the technical features should be considered as falling within the scope recorded in this specification provided that the combinations of the technical features are compatible with each other.

The foregoing embodiments only show several implementations of this application and are described in detail, but they should not be construed as a limit to the patent scope of this application. It should be noted that, a person of ordinary skill in the art may make various changes and improvements without departing from the ideas of this application, which shall all fall within the protection scope of this application. Therefore, the protection scope of the patent of this application shall be subject to the appended claims.

What is claimed is:

1. A protection circuit, comprising a controlled switch circuit, a voltage threshold circuit, a voltage clamp circuit, and a front-end threshold circuit, wherein:
   an input end of the controlled switch circuit is configured to receive a logic signal, an output end of the controlled switch circuit is configured to be connected to an input end of a drive chip, and a controlled end of the controlled switch circuit is connected to the output end of the controlled switch circuit through the voltage threshold circuit;
   the controlled end of the controlled switch circuit is further configured to be grounded through the voltage clamp circuit;
   the voltage threshold circuit is configured to be turned on when a voltage at the output end of the controlled switch circuit is greater than a first preset voltage; and
   the controlled switch circuit is configured to be turned off with no conduction between the input end and the output end of the controlled switch circuit when the voltage threshold circuit is turned on;
   wherein the output end of the controlled switch circuit is configured to be grounded through the front-end threshold circuit; and
   wherein the front-end threshold circuit is configured to be turned on when the voltage at the output end of the controlled switch circuit is greater than a second preset voltage, wherein the first preset voltage is greater than the second preset voltage.

2. The protection circuit according to claim 1, wherein the controlled switch circuit comprises an electronic switch or a field effect transistor.

3. The protection circuit according to claim 2, wherein the field effect transistor comprises a P-channel field effect transistor.

4. The protection circuit according to claim 1, wherein:
   the voltage threshold circuit comprises a first voltage regulator diode; and
   a positive electrode of the first voltage regulator diode is connected to the controlled end of the controlled switch circuit, and a negative electrode of the first voltage regulator diode is connected to the output end of the controlled switch circuit.

5. The protection circuit according to claim 1, wherein:
   the front-end threshold circuit comprises a second voltage regulator diode; and
   a positive electrode of the second voltage regulator diode is configured to be grounded, and a negative electrode of the second voltage regulator diode is connected to the output end of the controlled switch circuit.

6. The protection circuit according to claim 1, wherein the voltage clamp circuit comprises a clamp resistor.

7. The protection circuit according to claim 5, further comprising a protective resistor, wherein a positive electrode of the second voltage regulator diode is grounded through the protective resistor.

8. The protection circuit according to claim 3, further comprising a bias resistor, wherein a gate of the P-channel field effect transistor is connected to a source of the P-channel field effect transistor through the bias resistor.

9. A drive device, comprising a drive chip and a protection circuit, wherein:
   the protection circuit comprises a controlled switch circuit, a voltage threshold circuit, a voltage clamp circuit, and a front-end threshold circuit;
   an input end of the controlled switch circuit is configured to receive a logic signal, an output end of the controlled switch circuit is configured to be connected to an input end of the drive chip, and a controlled end of the controlled switch circuit is connected to the output end of the controlled switch circuit through the voltage threshold circuit;
   the controlled end of the controlled switch circuit is further configured to be grounded through the voltage clamp circuit;
   the voltage threshold circuit is configured to be turned on when a voltage at the output end of the controlled switch circuit is greater than a first preset voltage;
   the controlled switch circuit is configured to be turned off with no conduction between the input end and the output end of the controlled switch circuit when the voltage threshold circuit is turned on;
   the output end of the controlled switch circuit is configured to be grounded through the front-end threshold circuit;
   the front-end threshold circuit is configured to be turned on when the voltage at the output end of the controlled switch circuit is greater than a second preset voltage, wherein the first preset voltage is greater than the second preset voltage; and
   an output end of the drive chip is configured to output a drive signal to a display array of a crystal liquid display panel.

10. The drive device according to claim 9, wherein the controlled switch circuit comprises an electronic switch or a field effect transistor.

11. The drive device according to claim 10, wherein the field effect transistor comprises a P-channel field effect transistor.

12. The drive device according to claim 9, wherein:
    the voltage threshold circuit comprises a first voltage regulator diode; and
    a positive electrode of the first voltage regulator diode is connected to the controlled end of the controlled switch circuit, and a negative electrode of the first voltage regulator diode is connected to the output end of the controlled switch circuit.

13. The drive device according to claim 9, wherein:
    the front-end threshold circuit comprises a second voltage regulator diode; and
    a positive electrode of the second voltage regulator diode is configured to be grounded, and a negative electrode of the second voltage regulator diode is connected to the output end of the controlled switch circuit.

14. The drive device according to claim 9, wherein the voltage clamp circuit comprises a clamp resistor.

15. The drive device according to claim 13, further comprising a protective resistor, wherein a positive electrode of the second voltage regulator diode is grounded through the protective resistor.

16. The drive device according to claim 11, further comprising a bias resistor, wherein a gate of the P-channel field effect transistor is connected to a source of the P-channel field effect transistor through the bias resistor.

17. A display apparatus, comprising a display module and a drive device, wherein:
- the drive device comprises a drive chip and a protection circuit;
- the protection circuit comprises a controlled switch circuit, a voltage threshold circuit, a voltage clamp circuit, and a front-end threshold circuit;
- an input end of the controlled switch circuit is configured to receive a logic signal, an output end of the controlled switch circuit is configured to be connected to an input end of the drive chip, and the controlled end of the controlled switch circuit is connected to an output end of the controlled switch circuit through the voltage threshold circuit;
- the controlled end of the controlled switch circuit is further configured to be grounded through the voltage clamp circuit;
- the voltage threshold circuit is configured to be turned on when a voltage at the output end of the controlled switch circuit is greater than a first preset voltage;
- the controlled switch circuit is configured to be turned off with no conduction between the input end and the output end of the controlled switch circuit when the voltage threshold circuit is turned on;
- the output end of the controlled switch circuit is configured to be grounded through the front-end threshold circuit;
- the front-end threshold circuit is configured to be turned on when the voltage at the output end of the controlled switch circuit is greater than a second preset voltage, wherein the first preset voltage is greater than the second preset voltage; and
- an output end of the drive chip is configured to output a drive signal to a display array of a crystal liquid display panel; and
- the drive chip is configured to drive a display array in the display module.

\* \* \* \* \*